(12) United States Patent
Potter et al.

(10) Patent No.: US 10,882,147 B2
(45) Date of Patent: Jan. 5, 2021

(54) HEATSINK WITH RETENTION MECHANISMS

(71) Applicant: HEWLETT PACKARD ENTERPRISE DEVELOPMENT LP, Houston, TX (US)

(72) Inventors: Andrew Potter, Houston, TX (US); Daniel W Tower, Houston, TX (US); James Schulze, Houston, TX (US); John Grady, Cypress, TX (US); Sunil Ganta, Cypress, TX (US); Chong Tan, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 70 days.

(21) Appl. No.: 16/149,100

(22) Filed: Oct. 1, 2018

(65) Prior Publication Data

US 2020/0101570 A1 Apr. 2, 2020

(51) Int. Cl.
*F28F 7/00* (2006.01)
*B23P 19/04* (2006.01)
*H05K 7/20* (2006.01)

(52) U.S. Cl.
CPC ............ *B23P 19/04* (2013.01); *H05K 7/2039* (2013.01)

(58) Field of Classification Search
CPC .............................. B23P 19/04; H05K 7/2039
USPC ........................................................ 165/80.3
See application file for complete search history.

(56) References Cited

U.S. PATENT DOCUMENTS

| | | | |
|---|---|---|---|
| 7,161,808 B2 | 1/2007 | Atkinson | |
| 7,385,823 B1 | 6/2008 | Desrosiers et al. | |
| 7,869,217 B2 | 1/2011 | Chen et al. | |
| 7,961,473 B1 | 6/2011 | Bohannon et al. | |
| 8,867,211 B2 | 10/2014 | Wiltzius | |
| 2005/0160592 A1* | 7/2005 | Eckblad | H01L 21/4882 29/832 |
| 2007/0258194 A1* | 11/2007 | Okayama | H01L 25/162 361/600 |

(Continued)

OTHER PUBLICATIONS

System x Information; "Installing a Microprocessor and Heat Sink"; 8 pages; printed on Mar. 14, 2018 from: http://systemx.lenovofiles.com/help/index.jsp?topic=%2Fcom.lenovo.sysx.5464.doc%2Ftinst_microprocessor_heatsink_option.html.

*Primary Examiner* — Davis D Hwu
(74) *Attorney, Agent, or Firm* — Hewlett Packard Enterprise Patent Department

(57) ABSTRACT

Examples described herein include an assembly. The assembly may be a heatsink assembly or some other cooling assembly (for example, a liquid cooling assembly). The heatsink or cooling assembly may include a heatsink or some other cooling means, such as a liquid cooling device. The heatsink or cooling assembly may include a base. The heatsink itself may connect to a base or the bottom of the heatsink may form the base. The base may interface or connect to a bolster plate. The base may interface or connect to a bolster plate via apertures in the base and fasteners included on the base and the bolster plate. The heatsink or cooling assembly may include one or more apertures to accept one or more guide pins and/or retention pins on the bolster plate. The base may include retention mechanisms positioned over the apertures to attach to retention pins on the bolster plate. The retention pins may be the guide pins with retention features.

10 Claims, 12 Drawing Sheets

(56) References Cited

U.S. PATENT DOCUMENTS

2019/0200479 A1\* 6/2019 Yatskov .............. H01L 23/4006
2019/0302857 A1\* 10/2019 Buddrius ................ H01L 23/34

\* cited by examiner

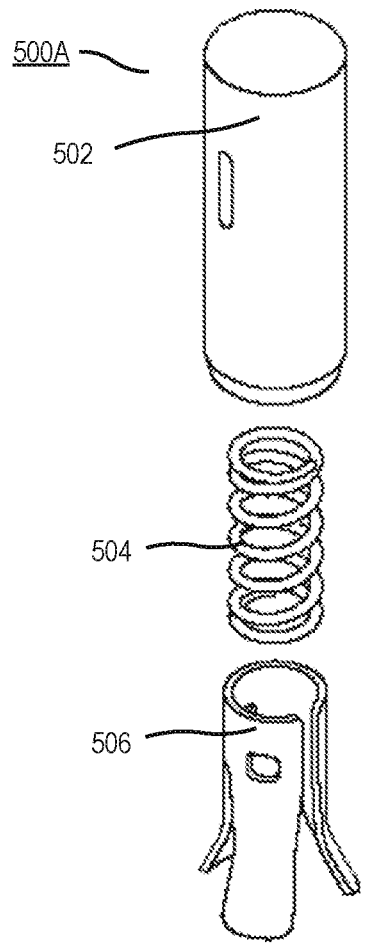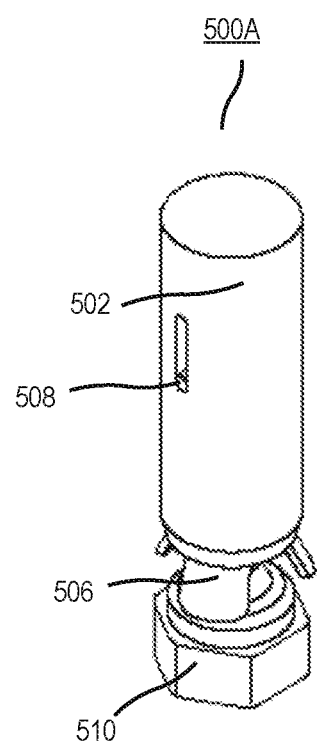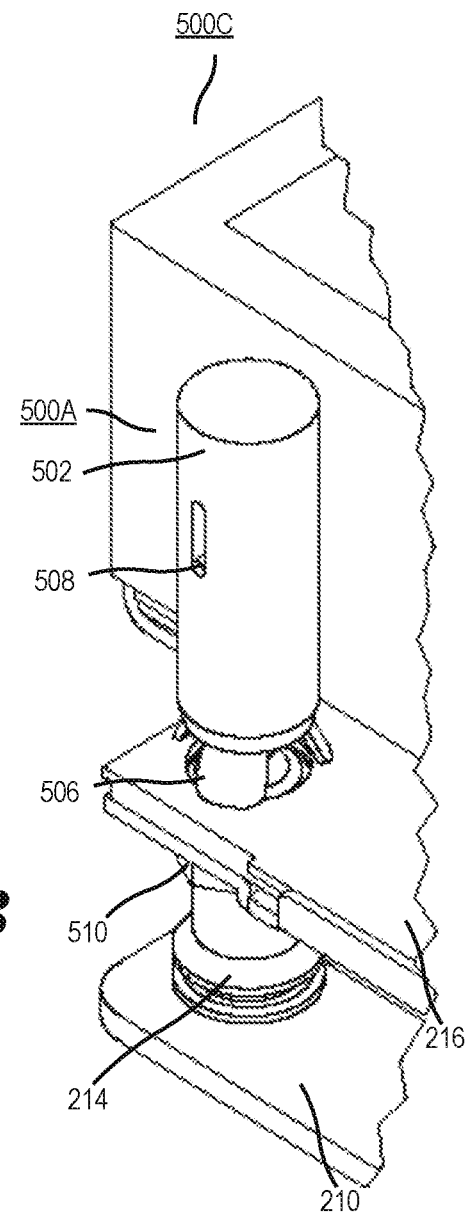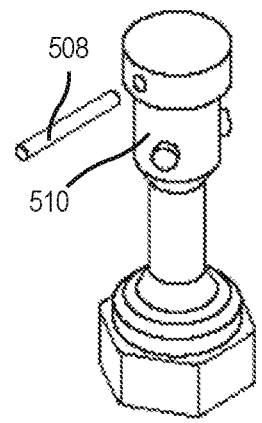
*FIG. 5A*
*FIG. 5B*
*FIG. 5C*

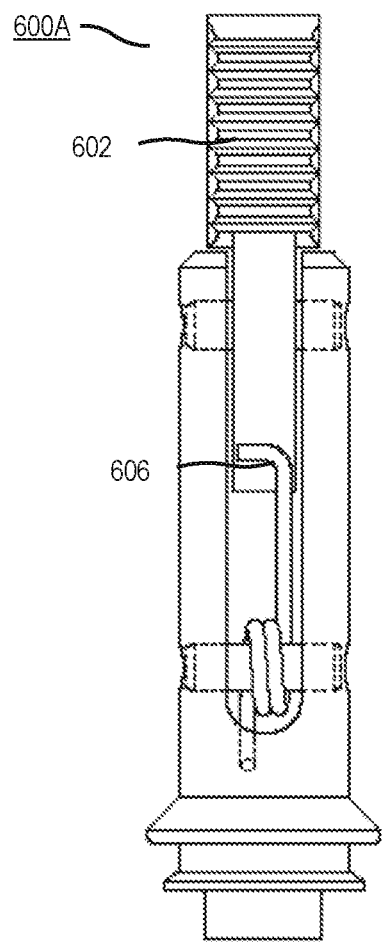 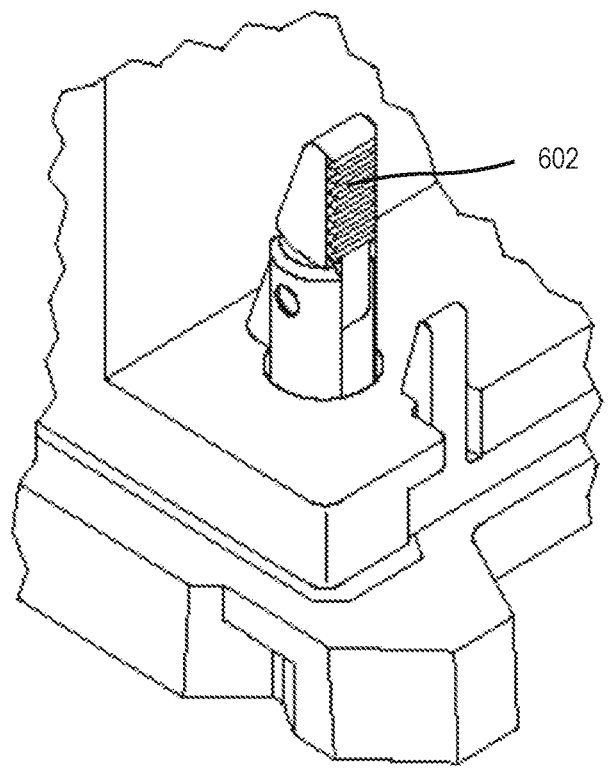
*FIG. 6A*  *FIG. 6B*

HEATSINK WITH RETENTION MECHANISMS

BACKGROUND

Heatsink installation and/or removal may include specific sequences. In other words, during the installation of a heatsink, different screws may be tightened, in a specific sequence, to a bolster plate positioned over a heat generating component. In some cases, if the sequence is not followed, issues may occur, such as insufficient contact with the heat generating component or damage to various components within a system. In addition, some processors may have a high mechanical load. In such cases, current tool-less heatsink designs may be insufficient, in that the tool-less heatsink may not provide the proper mechanical load.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIG. 5A is an exploded view of a plunger retention mechanism, according to an example;

FIG. 5B is a schematic view of the plunger retention mechanism, according to an example;

FIG. 5C is a close up schematic view of a heatsink assembly with the plunger retention mechanism installed on a bolster plate, according to an example;

FIG. 6A is a schematic view of a retention mechanism included on a bolster plate, according to an example;

FIG. 6B is a schematic view of a retention mechanism included on the bolster plate with a heatsink assembly installed, according to an example;

DETAILED DESCRIPTION

Figure 1:
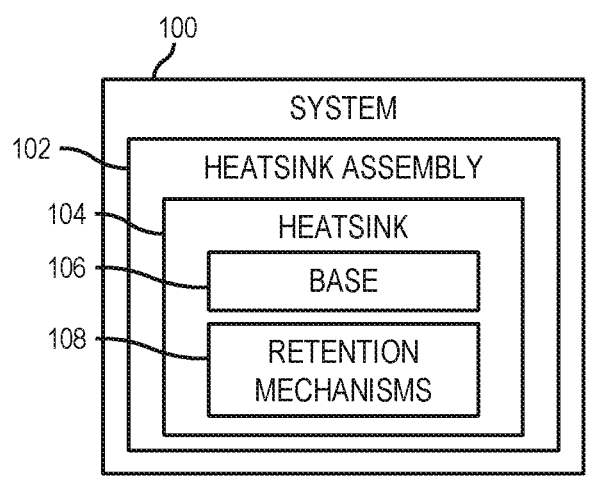
FIG. 1 is a block diagram of a system including a heatsink assembly, according to an example.

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Computing devices may include components that generate heat. The heat generating components may include devices to move heat away from or cool the heat generating components. One device to move heat away from a heat generating component may be a heatsink. A heat generating component may be surrounded by a bolster plate. The bolster plate may be configured to accept a heatsink and allow the heatsink to be installed with the proper mechanical load or pressure, while not damaging the board that the heat generating component is installed on or the heat generating component itself. Heatsink installation and/or removal may include specific sequences. In other words, during the installation of a heatsink, different screws may be tightened in a specific sequence to a bolster plate positioned over a heat generating device. In some cases, if the sequence is not followed, issues may occur, such as insufficient contact with the heat generating device, tilting of the heatsink (thus preventing complete installation or complete contact), or damage to various components within a system. In addition, some heat generating devices may have a high mechanical load (to ensure proper cooling). In such cases, current tool-less heatsink designs may be insufficient, in that the tool-less heatsink may not provide the proper mechanical load.

Examples described herein include an assembly. The assembly may be a heatsink assembly or some other cooling assembly (for example, a liquid cooling assembly). The heatsink or cooling assembly may include a heatsink or some other cooling means, such as a liquid cooling device. The heatsink or cooling assembly may include a base. The heatsink itself may connect to a base or the bottom of the heatsink may form the base. The base may interface or connect to a bolster plate. The base may interface or connect to a bolster plate via apertures in the base and fasteners included on the base and the bolster plate. The heatsink or cooling assembly may include one or more apertures to accept one or more guide pins and/or retention pins on the bolster plate. The base may include retention mechanisms positioned over the apertures to attach to retention pins on the bolster plate. The retention pins may be the guide pins with retention features.

Accordingly, various examples may include a system 100. The system 100 may include a heatsink assembly 102. The heatsink assembly 102 may include a heatsink 104. The heatsink 104 may include a base 106 (as in, the bottom of the heatsink may form the base 106) or be attached to a base 106. The base 106 may include an aperture or plurality of apertures. The base 106 may include retention mechanisms 108. The retention mechanisms 108 may be positioned over the one or more apertures. The retention mechanisms 108 may lock onto the retention pins of a bolster plate.

As used herein, a "computing device" may be a storage array, storage device, storage enclosure, server, desktop or laptop computer, computer cluster, node, partition, virtual machine, or any other device or equipment including a controller, a processing resource, or the like. In examples described herein, a "processing resource" may include, for example, one processor or multiple processors included in a single computing device or distributed across multiple computing devices. As used herein, a "processor" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, a "heat generating component" may refer to a processing resource or some other electronic component that generates heat during operation. For example, the heat generating component may be a solid state storage device, a transceiver, a switch, some mechanical component that generates heat, or any other component that may generate heat. In another example, the heat generating component may be a CPU. In an example, the heat generating component may have a certain operating temperature. A heatsink assembly may be utilized to maintain the operating temperature of the heat generating component.

As used herein, a "bolster plate" may refer to rectangular or square shaped metal frame. The frame or bolster plate may surround a socket disposed on a printed circuit board (PCB). Further, the frame or bolster plate may be secured to the PCB. For example, the bolster plate may be secured to the PCB via weld, fasteners, or other similar means. The socket may accept a processing resource or other component. The bolster plate may include guide pins and/or retention pins. The guide pins may include or be fitted with retention features. The bolster plate may include fasteners. The fasteners may include screws. Guide pins and/or retention pins may be attached or fastened to some of the fasteners or screws on the bolster plate. A heatsink assembly may fit over the guide pins and/or retention pins. After a heatsink assembly is added over the guide pins and/or retention pins, fasteners (for example, a nut) on the heatsink assembly may fasten to the rest of the fasteners on the bolster plate (e.g., the screws). In other words, a user may tighten the nuts on the screws.

FIG. 1 is a block diagram of a system 100 including a heatsink assembly 102, according to an example. As noted above, the heatsink assembly 102 may include a heatsink 104. In another example, the system 100 may include other cooling devices than a heatsink 104 (for example, a liquid cooling device). In an example, the heatsink assembly 102 may include a base 106. In another example, the heatsink 104 may include a bottom part or section which may form the base 106. In other words, rather than a base 106 attached to a heatsink 104, the heatsink assembly 102 may include a heatsink 104 with an integrated base 106. In another example, the base 106 may include a plurality of apertures. In a further example, retention mechanisms 108 may be positioned over or attached to the apertures. In an example, when the heatsink assembly 102 is added to a bolster plate, the retention mechanisms 108 may lock onto the guide pins and/or retention pins on the bolster plate. In another example, a guide pin may include a retention feature.

In another example, the apertures may be located at the corners of the base 106 of the heatsink assembly 102. Further, the apertures may align with the guide pins and/or retention pins of a bolster plate. In another example, the apertures may be located in other locations on the base 106. Further, not all apertures may align with the guide pins and/or retention pins of the bolster plate. For example, the heatsink assembly 102 may include two apertures on the base 106 to align with fasteners on the bolster plate. Further, those two apertures may include fasteners to fasten to the fasteners included on the bolster plate. For example, a nut may be positioned over or attached to the aperture to fasten to a screw attached to the bolster plate.

In another example, a user may add, mount, or install the heatsink assembly 102 to a bolster plate. In such cases, a heat generating component may be disposed on a PCB or any other board capable of including heat generating components. Further, the bolster plate may surround the heat generating component. Further still, the bolster plate may be secured or attached to the PCB. The heat generating component may be centered inside the bolster plate. When a heatsink assembly 102 is added to the bolster plate, a bottom portion of the heatsink assembly 102 may interface with, make contact with, or touch the heat generating component. To ensure proper contact, a user may tighten the fasteners on the heatsink assembly 102 to the fasteners on the bolster plate. Prior to the fasteners being tightened, the heatsink assembly 102 may be retained on the bolster plate via the retention mechanisms 108 of the heatsink assembly 102. The retention of the heatsink assembly 102 to the bolster plate may allow a user to tighten the fasteners without issue (in other words, the fasteners may be tightened in any order).

Figure 2A:
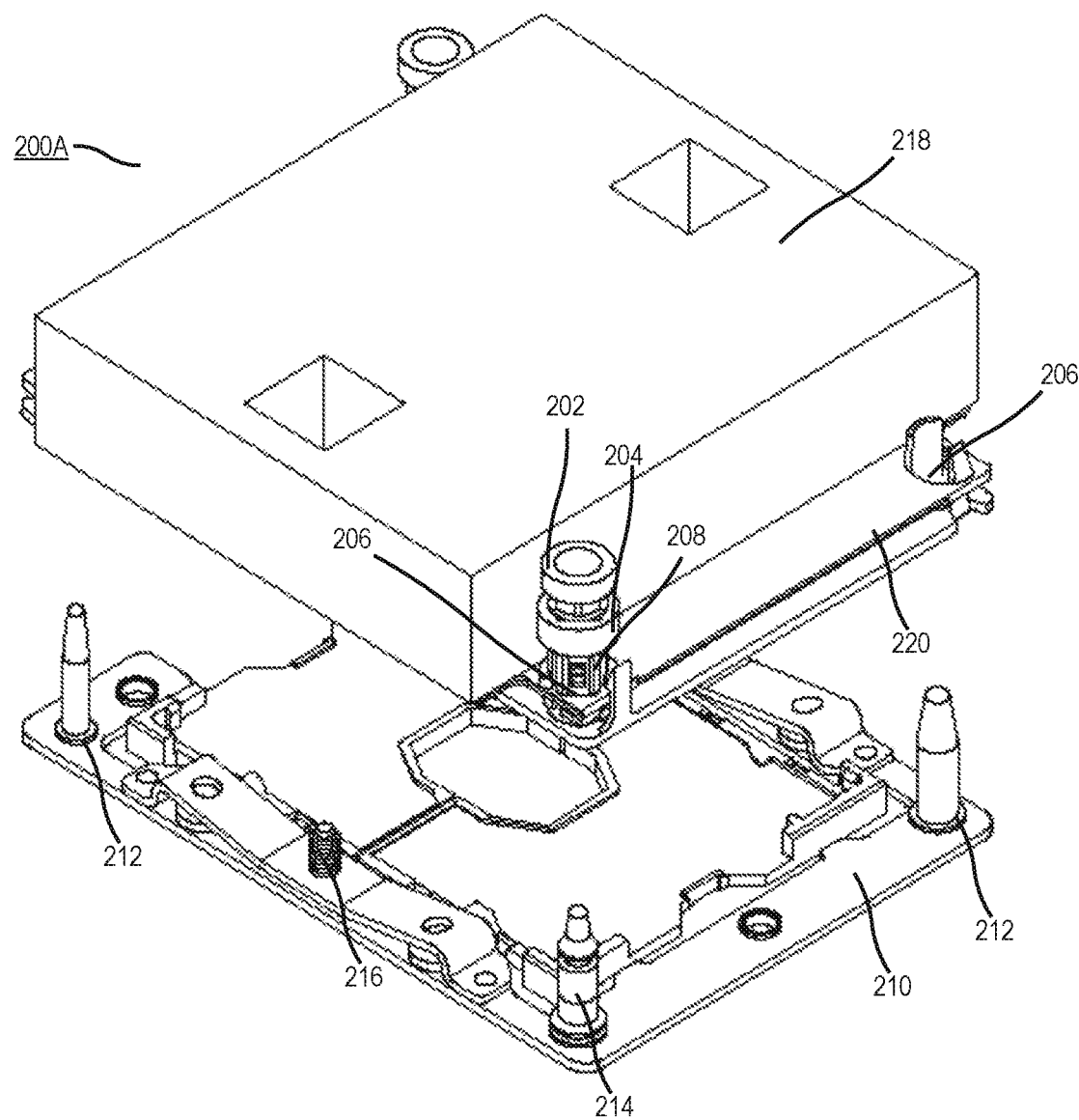
FIG. 2A is a schematic view of a heatsink assembly and bolster plate, according to an example.

FIG. 2A is a schematic view of a heatsink assembly 200A and bolster plate 210, according to an example. In an example, the heatsink assembly 200A may include a heatsink 218. In another example, the heatsink 218 may be attached to or include a base 220 (as in, the bottom portion of the heatsink 218 may form a base 220. In such examples, the base 220 may include apertures 206 (not all apertures are shown). In an example, the base 220 may include four apertures 206 (two of which are not visible) to align with the guide pins 212, retention pins 214, and/or guide pins with added retention features. In another example, a retention mechanism may be attached to or positioned over the apertures 206. In a further example, the retention mechanism may be attached to or positioned over two or more of the apertures 206.

In another example, the retention mechanism may be a push button retention mechanism. In such examples, the push button retention mechanism may include a push button 202, a lock ring 204, and a retainer 208. In such examples, a guide pin 212 may be included on a bolster plate 210. In a further example, the guide pin 212 may include a retention feature. In another example, the bolster plate 210 may include a retention pin 214. In an example, the push button retention mechanism may lock onto the retention pin 214 or a guide pin 212 with a retention feature. Prior to locking onto a retention pin 214, the lock ring 204 may be positioned in an up position (indicating that the push button retention mechanism is not locked). When the heatsink assembly 200A is pushed down or placed onto the bolster plate 210, the retention pins 214 and guide pins 212 may pass through the apertures 206. As the retention pins 214 pass through the apertures 206 with the push button retention mechanism, the retainer 208 may automatically latch onto the retention pins 214. The retainer 218 may latch onto the retention pin 214 via the spring force of the material that retainer 208 may be composed of. Further, as the retainer 208 latches to the retention pin 214, a user may slide the lock ring 204 into a down position (in other words, a locked position) to lock the push button retention mechanism to the retention pins 214. To unlock the push button retention mechanism, a user may slide the lock ring 204 into an up position (in other words, an unlocked position). To remove the heatsink assembly 200A, while the lock ring 204 is in an up position (in other words, an unlocked position) a user may depress or push down the push button 202. The act of pushing the push button 202 may actuate the retainer 208 to unlatch or release from the retention pin 214. In other words, the act of pushing down or depressing the push button 202 may allow for removal of the heatsink assembly 200A, when the lock ring is in an up position (in other words, an unlocked position). As shown in FIG. 2A, the lock ring 204 is in an up position (in other words, an unlocked position) and the heatsink assembly 200A is not on the bolster plate 210. In another example, after the push button retention mechanism latches onto the retention pins 214, a user may tighten a fastener (not shown) located on the heatsink assembly to the fastener 216 located on the bolster plate 210. In an example, the bolster plate 210 may include more than one fastener 216.

Figure 2B:
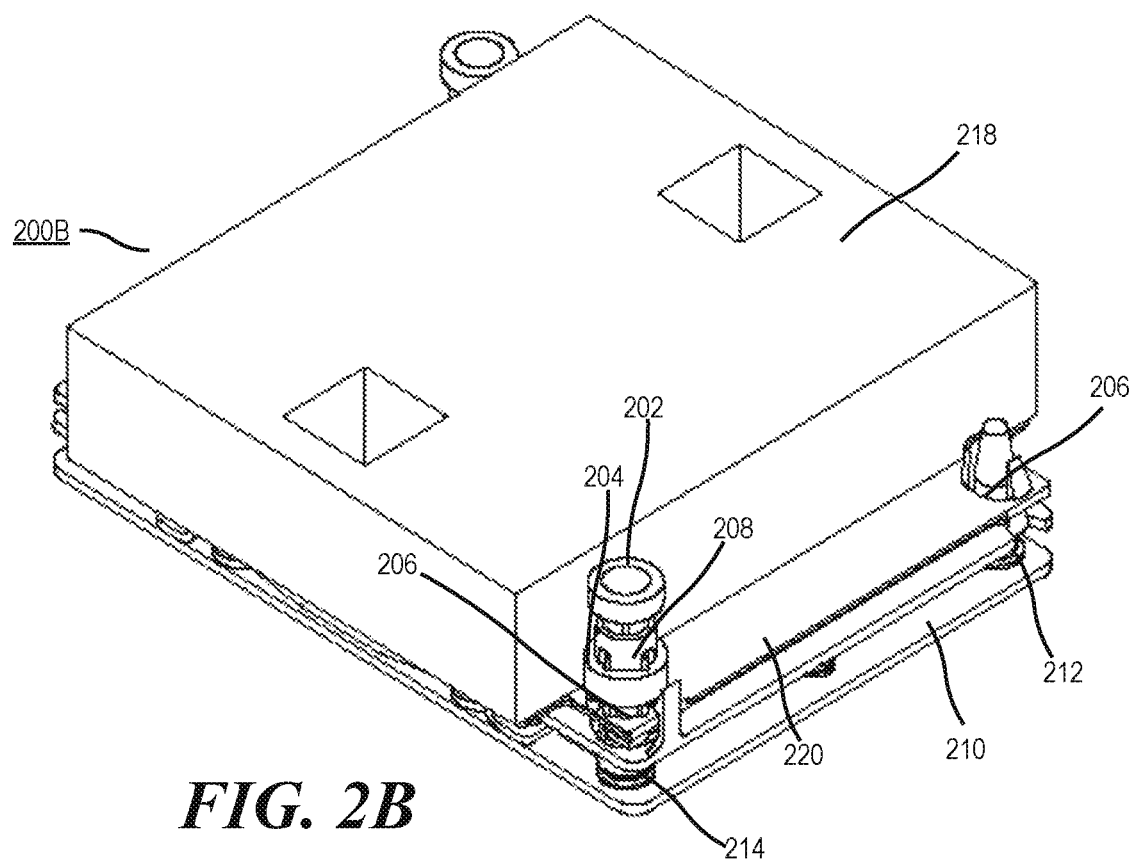
FIG. 2B is a schematic view of a heatsink assembly installed on a bolster plate, according to an example.

FIG. 2B is a schematic view of a heatsink assembly 200B installed on a bolster plate 210, according to an example. In an example and as noted above, the heatsink assembly 200A may be added to a bolster plate 210. FIG. 2B is an illustration of the heatsink assembly 200B installed or added on to the bolster plate 210. In such examples, a user may slide the lock ring 204 to a down position or, in other words, a locked position. To remove the heatsink assembly 200B, if the lock ring 204 is in a down position, a user may slide the lock ring 204 to an up position, then a user may actuate the push button retention mechanism by pushing or depressing the push button 202 down. The action of pushing the push button 202 down may actuate the retainer 208, thus releasing or unlatching the retainer 208 from the retention pin 214. After all push button retention mechanisms are unlatched or released from retention pins 214 and any fasteners are loosened, a user may remove the heatsink assembly 200B by lifting the heatsink assembly 200B up.

Figure 2C:
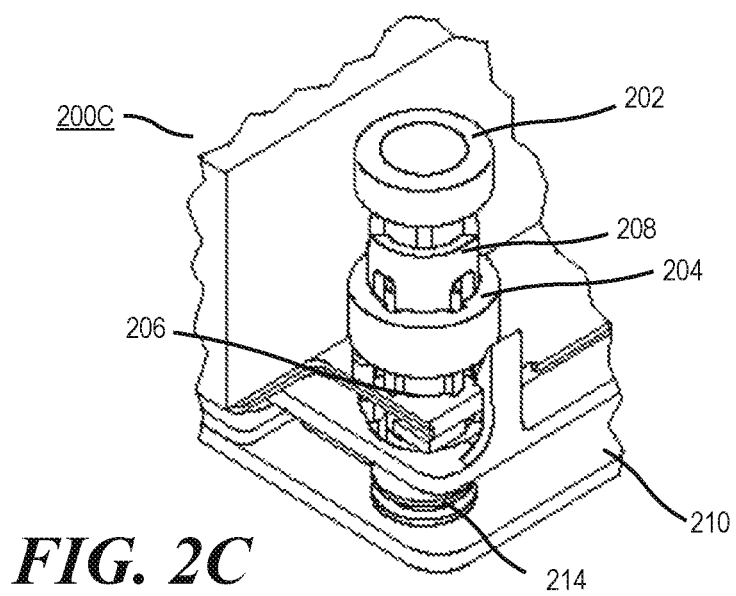
FIG. 2C is a close-up schematic view of a push button retention mechanism of the heatsink assembly, according to an example.

FIG. 2C is a close-up schematic view of a push button retention mechanism 200C of the heatsink assembly 200A, 200B, according to an example. As noted above, the push button retention mechanism 200C may include a push button 202 (to actuate the retainer 208), a lock ring 204, and a retainer 208. The retainer 208 may attach or lock onto to a retention feature attached to a guide pin 212 or a retention pin 214. In another example, when the heatsink assembly 200A, 200B is placed onto the bolster plate 210, the retention pins 214 and/or guide pins 212 may pass through the apertures 206 and extend into or partially extend into the push button retention mechanism 200C. In such examples, as the retention pin 214 extends into the aperture, the retainer 208 may automatically latch to the retention pin 214 via the spring force of the material of the retainer 208. Further, to lock the push button retention mechanism, a user may slide the lock ring 204 down (in other words, a locked position). Further, for a locked push button retention mechanism 200C, a user may slide the lock ring 204 into an up position (in other words, an unlocked position). To release or unlatch the retainer 208 from a retention pin 214, a user may push or depress the push button 202. In such examples, the act of pushing the push button 202 down may actuate the retainer 208, thus releasing or unlatching the retainer from the retention pin 214.

Figure 2E:
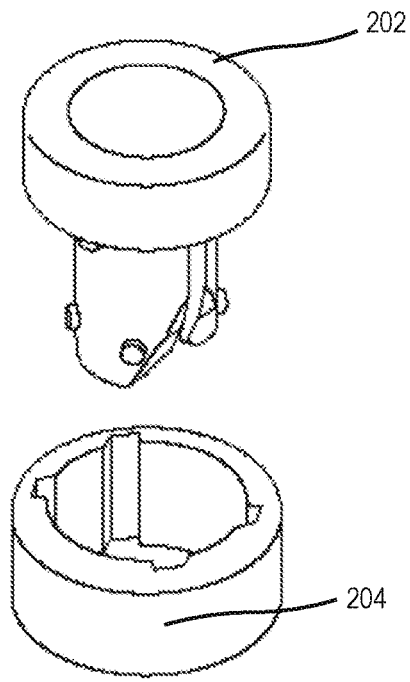
FIG. 2E is a schematic view of the push button retention mechanism in a locked position, according to an example.
Figure 2E:
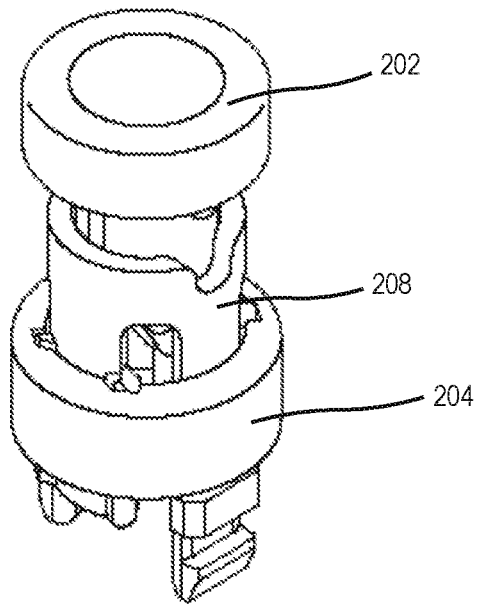
Figure 2D:
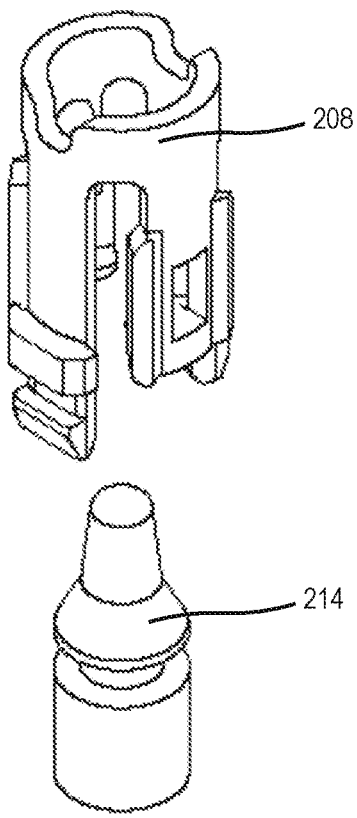
FIG. 2D is an exploded view of the push button retention mechanism of the heatsink assembly, according to an example.

FIG. 2D is an exploded view of the push button retention mechanism 200C of the heatsink assembly 200A, 200B, according to an example. As shown, the lock ring 204 slides over the retainer 208. The push button 202 fits into the lock ring 204 and retainer 208. When the push button 202 is pushed downwards or actuated, while the lock ring 204 is in an up position or unlocked position, the retainer 208 may actuate and release or unlatch from a retention pin 214. When the push button 202 is pushed downwards or actuated, while the lock ring 204 is in a down position or locked position, the lock ring 204 may prevent the retainer 208 from actuating, thus the retainer 208 may not unlatch or release from the retention pin 214. In another example, the push button 202, lock ring 204, and retainer 208 may be comprised of plastic, metal, various other materials, or some combination thereof.

Figure 2F:
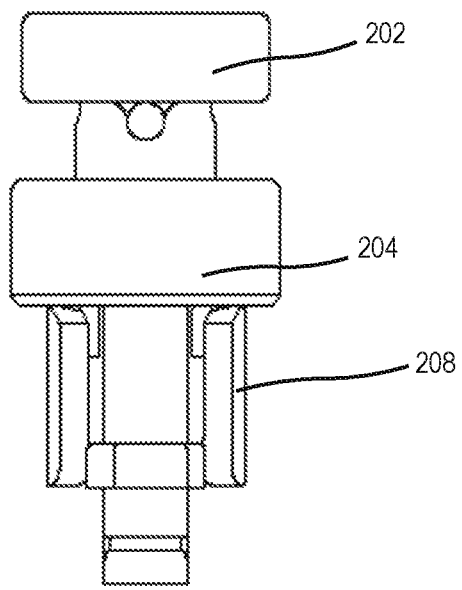
FIG. 2F is another schematic view of the push button retention mechanism in a locked position, according to an example.

FIG. 2E is a schematic view of the push button retention mechanism in a down position or locked position, according to an example. As noted above, when the heatsink assembly 200A, 200B is placed on the bolster plate 210, the retainer 208 may automatically latch to the retention pin 214. A user may slide the lock ring 204 down/up to lock/unlock the heatsink assembly 200A, 200B to/from the retention pins of the bolster plate 210. FIG. 2F is another schematic view of the push button retention mechanism in a down position or locked position, according to an example. FIG. 2F illustrates another view of FIG. 2E.

Figure 3A:
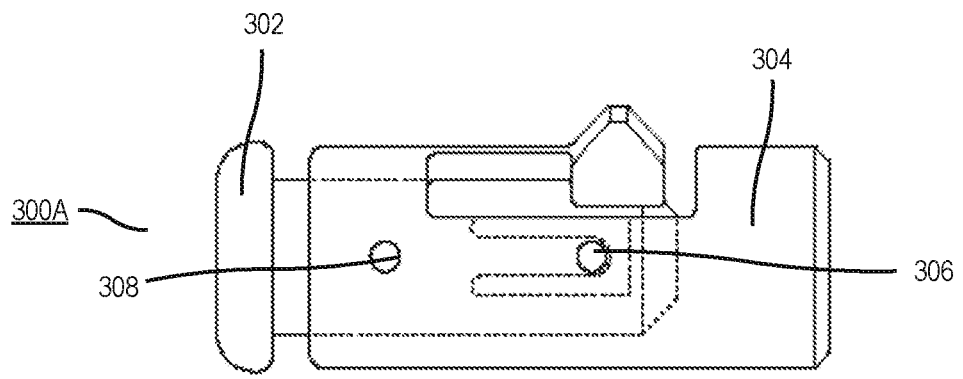
FIG. 3A is a schematic view of a pin retention mechanism in a locked position, according to an example.

FIG. 3A is a schematic view of a pin retention mechanism 300A in a locked position, according to an example. The pin retention mechanism 300A may include a pin 302 and a retainer 304. In an example, the retainer 304 may fit over a retention pin. In an example, when the pin retention mechanism 300A is in a locked position, a heatsink assembly may not be removed from a bolster plate. In another example, the pin 302 may include a raised bump to fit into a first opening 306 on the retainer 304 when the pin retention mechanism 300A is in the locked position.

Figure 3B:
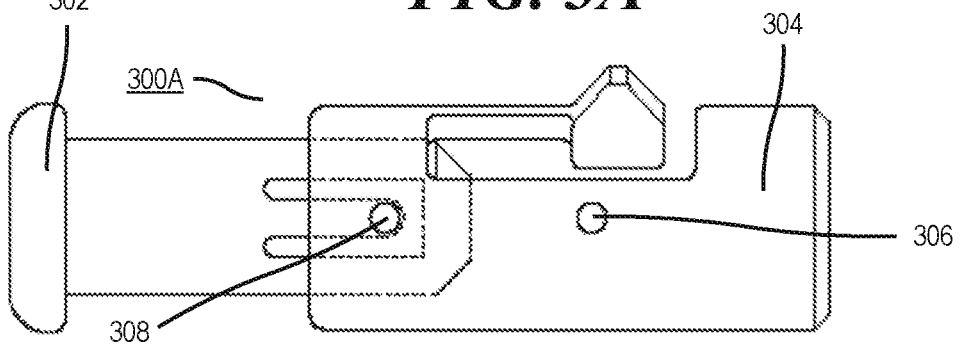
FIG. 3B is a schematic view of the pin retention mechanism in an unlocked position, according to an example.
Figure 3C:
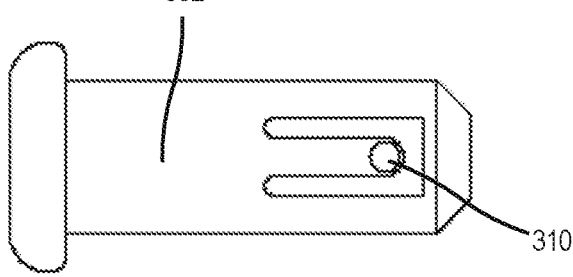
FIG. 3C is a schematic view of the pin of the pin retention mechanism, according to an example.
Figure 3D:
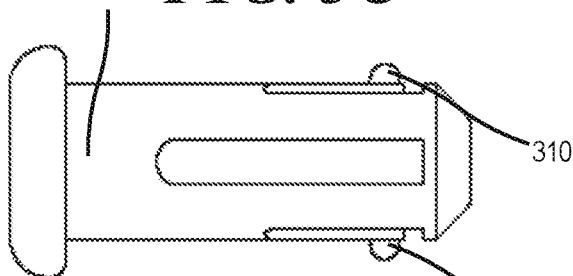
FIG. 3D is another schematic view of the pin of the pin retention mechanism, according to an example.

FIG. 3B is a schematic view of the pin retention mechanism 300A in an unlocked position, according to an example. In such examples, the pin 302 may extend from the retainer 304. When the pin 302 is in an unlocked position, the raised bump may fit into a second opening 308. To move the pin 302 from a locked position to an unlocked position a user may pull pin 302 up. To move the pin 302 from an unlocked position to a locked position, a user may push pin 302 down. FIG. 3C is a schematic view of the pin 302 of the pin retention mechanism 300A, according to an example. In an example, the pin 302 may be comprised of plastic, metal, various other materials, or some combination thereof. In another example the retainer 304 may be comprised of plastic, metal, various other materials, or some combination thereof. FIG. 3D is another schematic view of the pin 302 of the pin retention mechanism 300A, according to an example. As shown in FIG. 3D, the pin 302 may include a raised bump 310 on both sides of the pin 302. In such examples, the retainer 304 may include two openings 306 on both sides of the retainer 304 for the locked position and two openings 308 on both sides of the retainer 304 for the unlocked position.

Figure 4A:
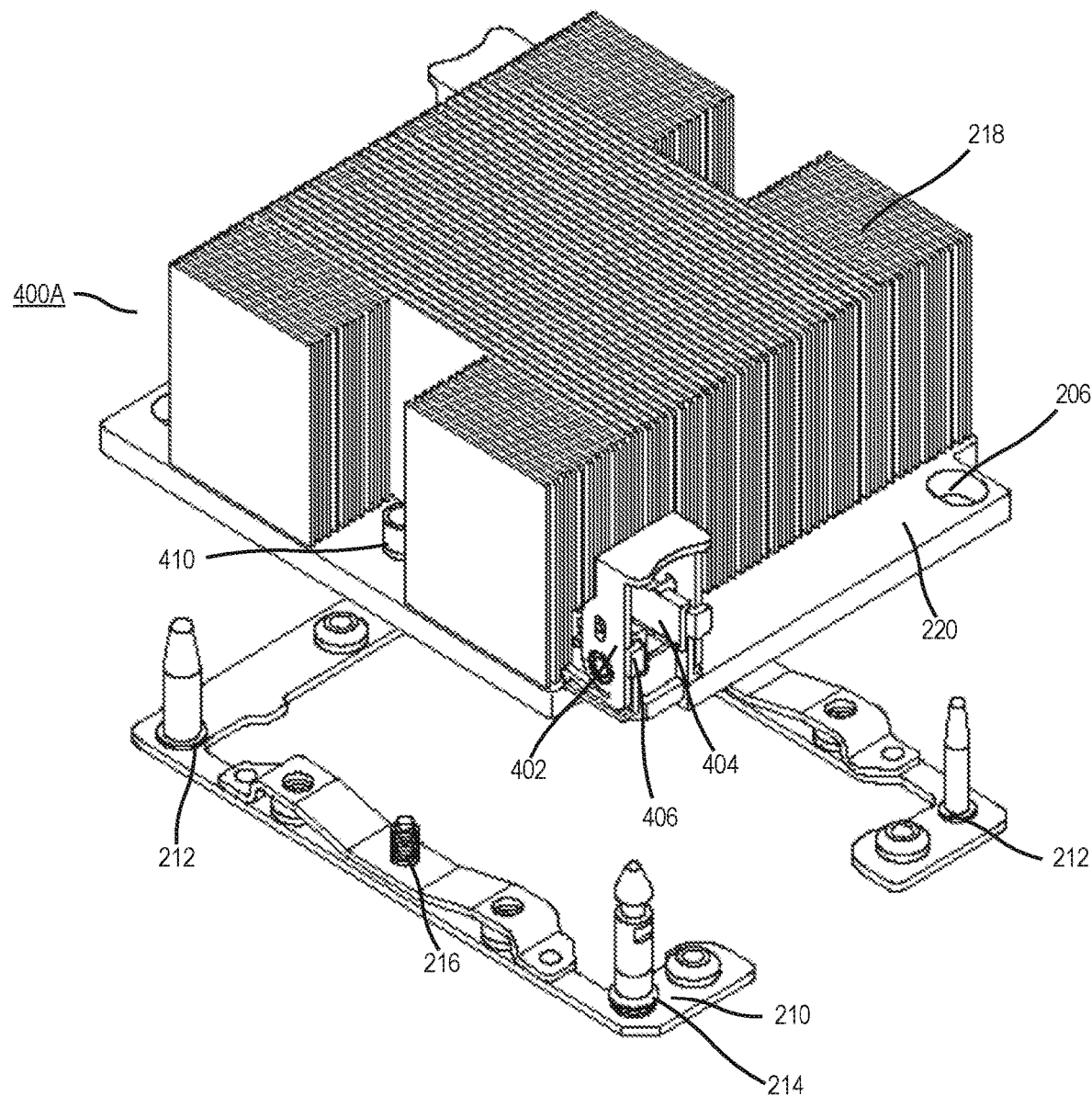
FIG. 4A is a schematic view of a heatsink assembly with a rocker retention mechanism and a bolster plate, according to an example.

FIG. 4A is a schematic view of a heatsink assembly 400A with a rocker retention mechanism, according to an example. In such examples, a heatsink assembly 400A may include a heatsink 218 or some other cooling means (such as liquid cooling attachments). In another example, the heatsink assembly 400A may include a base 220 with apertures 206. In such examples, one or more apertures may include (either positioned over or attached to the apertures) a retention mechanism (for example, the rocker retainer mechanism). Further, the base may include a fastener 410 to fasten to a fastener 216 on the bolster plate 210 (only one is shown in FIG. 4A, however additional fasteners may be included).

In an example, for a rocker retainer mechanism, a bolster plate may include retention pins 214 and/or guide pins 212. In another example, the retention pins may be guide pins 212 with an added retention feature. In an example, the retention feature may be added to any of the guide pins 212 included on the bolster plate 210.

In another example, the rocker retainer mechanism may include a spring loaded lever 402, a sliding lock 404, and a retainer housing 406. In an example, the spring loaded lever 402 may actuate the sliding lock 404. In other words, when the heatsink assembly 400A is mounted to a bolster plate 210, a user may depress the spring loaded lever 402 to actuate the sliding lock 404 to disengage from the retention pin. In another example, the retainer housing 406 may be rigidly attached, connected, or fastened to the base 220. In a further example, the retainer housing 406 may hold the rocker retention mechanism together and fix the rocker retention mechanism to the base 220. In another example, to mount the heatsink assembly, the user may add or mount the heatsink assembly 400A to a bolster plate 210. In other words, a user may place the heatsink assembly 400A on to the bolster plate 210. In such examples, when the heatsink assembly 400A is added or mounted to the bolster plate 210, a spring on the spring loaded lever 402 may automatically move the sliding lock 404 into a locked position, thus locking the sliding lock 404 onto the retention pins 214. In other words, the sliding lock 404 may slide towards the heatsink 218 (in other words, a locked position). This allows for ease of installation and use, while reducing the amount of errors that could be made otherwise.

Figure 4B:
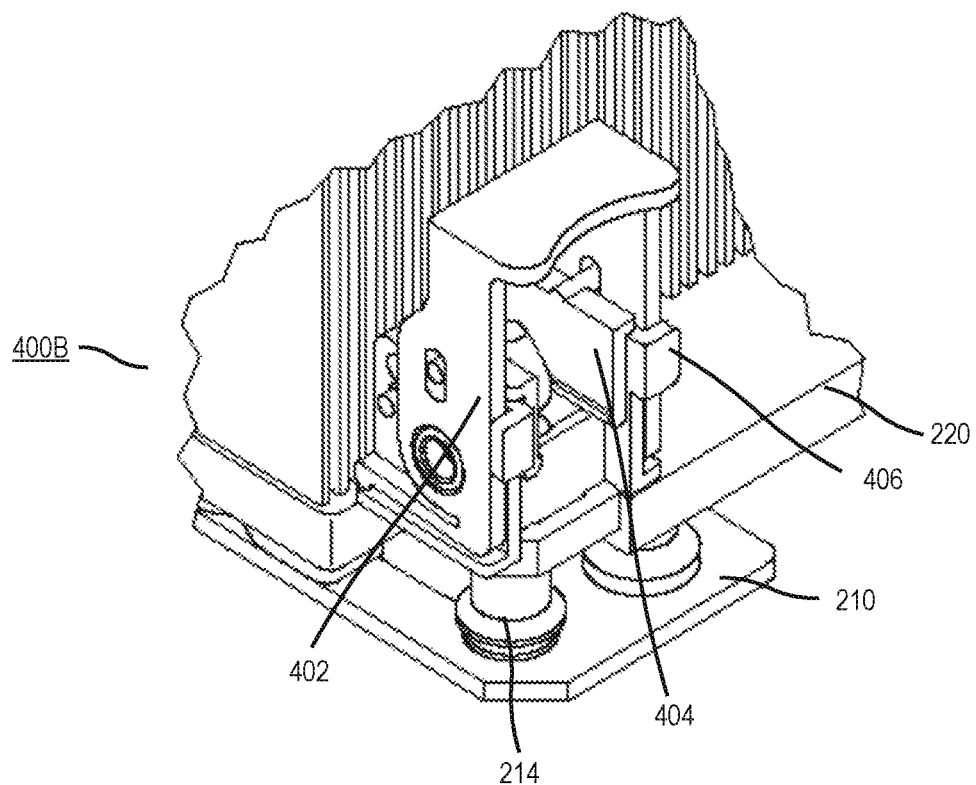
FIG. 4B is a schematic view of a heatsink assembly with a rocker retention mechanism installed on a bolster plate, according to an example.
Figure 4C:
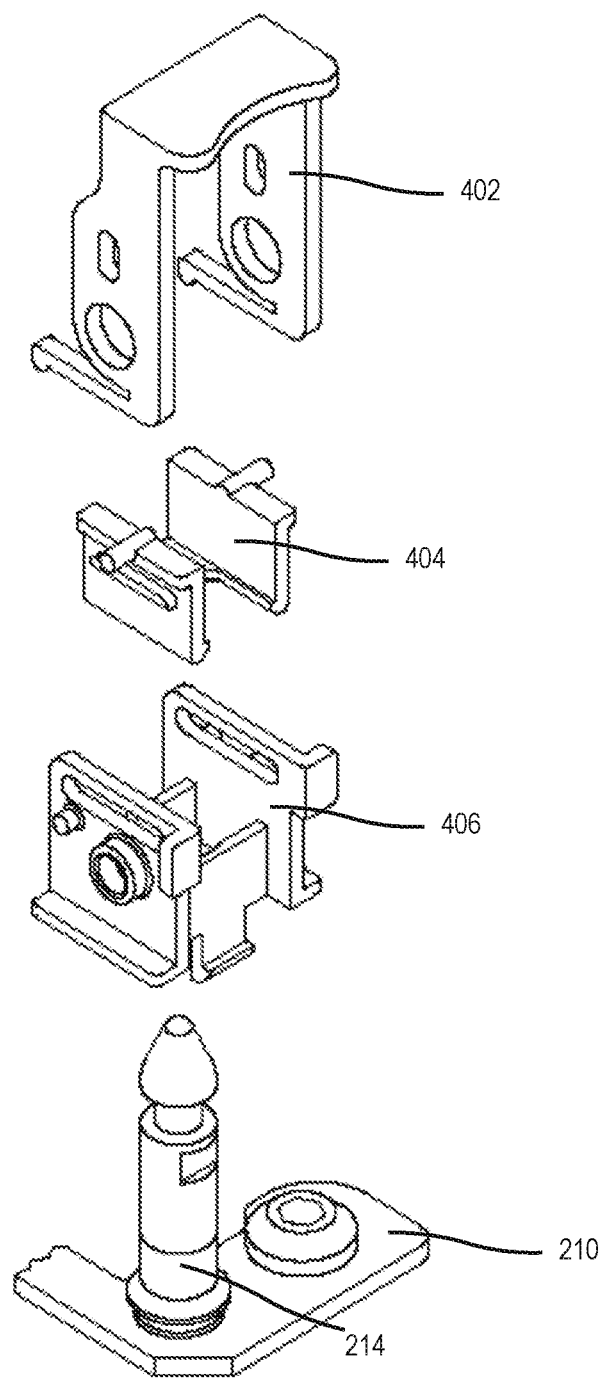
FIG. 4C is an exploded view of the rocker retention mechanism, according to an example.

FIG. 4B is a schematic view of a heatsink assembly 400B with a rocker retention mechanism installed on a bolster plate 210, according to an example. As shown in FIG. 4B, the heatsink assembly 400B may be installed on a bolster plate 210. In another example and as described above, once the heatsink assembly 400B is added to the bolster plate 210, the rocker retainer mechanism may automatically latch on to the retention pins 214 (or guide pins 212 with an added retention feature). Further, to remove the heatsink assembly 400B, a user may squeeze or depress the spring loaded lever 402 (thus actuating the sliding lock 404 and allowing for the heatsink assembly 400B to be removed). In other words, as the spring loaded lever 402 is depressed, the sliding lock 404 may slide forwards or away from the heatsink 218 (in other words, an unlocked position). FIG. 4C is an exploded view of the rocker retention mechanism, according to an example. As noted above, the rocker retention mechanism may include a spring loaded lever 402, a sliding lock 404, and a retainer housing 406. In another example, the spring loaded lever 402, sliding lock 404, and retainer housing 406 may be comprised of plastic, metal, various other materials, or some combination thereof.

FIG. 5A is an exploded view of a plunger retention mechanism 500A, according to an example. The plunger retention mechanism 500A may include an anchor 506 to attach to a retention stud 510, the retention stud to connect to a guide pin and/or retention pin 214 on the bolster plate 210. In another example, the plunger retention mechanism 500A may include a return spring 504, to return the plunger retention mechanism 500A to an unlocked state when actuated (actuated via the plunger 502). The plunger retention mechanism 500A may also include a plunger 502 to actuate the anchor 506 (thus unlocking the plunger retention mechanism 500A from a guide pin and/or retention pin 214 on the bolster plate 210). In another example, the plunger retention mechanism 500A may include a pin 508 to retain or connect the plunger 502 and anchor 506 to the retention stud 510. FIG. 5B is a schematic view of the plunger retention mechanism, according to an example. FIG. 5B illustrates a representation of what an assembled plunger retention mechanism 500A may look like. In another example, plunger 502, spring 504, anchor 506, pin 508, and retention stud 510 may be comprised of plastic, metal, various other materials, or some combination thereof.

FIG. 5C is a close up schematic view of a heatsink assembly 500C with the plunger retention mechanism 500A installed on a bolster plate 210, according to an example. FIG. 5C illustrates the plunger retention mechanism 500A in a locked position. To remove the heatsink assembly, a user may actuate, depress, or push down the plunger 502 (thus unlocking the plunger retention mechanism 500A from a guide pin and/or retention pin 214 on the bolster plate 210) and lift the heatsink assembly 500C from the bolster plate 210.

Figure 6C:
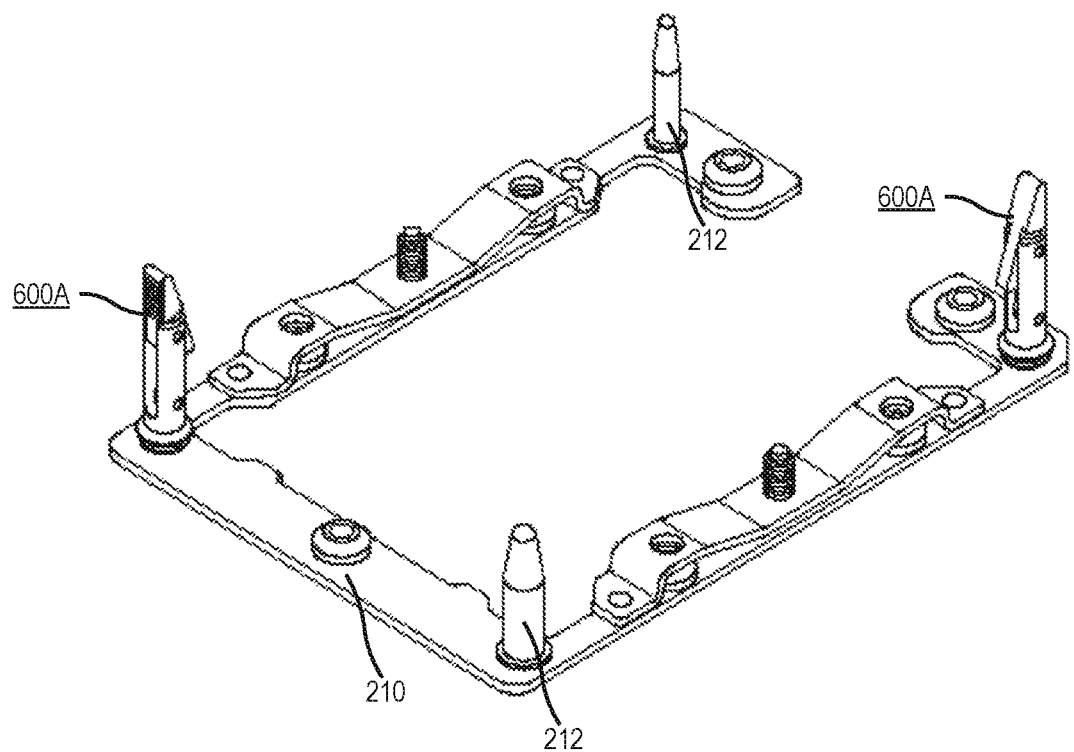
FIG. 6C is a schematic view of the bolster plate with the retention mechanism, according to an example.

FIG. 6A is a schematic view of a retention mechanism 600A included on a bolster plate, according to an example. In such examples, the retention mechanism 600A may be included on the guide pins of the bolster plate 210. In such examples, the retention mechanism may include a rocker retainer 602. The rocker retainer 602 may be pushed backwards, thus allowing passage through the apertures included on a base of the heatsink assembly. In addition, the retention mechanism 600A may include a spring 606. When the rocker retainer 602 is pushed backwards and force is no longer applied to the rocker retainer 602, the spring 606 may move the rocker retainer 602 back to the rocker retainers 602 original position. In such examples, the heatsink assembly may not include the retention mechanisms 600A on the heatsink assembly, rather, the bolster plate (via the guide pins or retention pins) may include the retention mechanisms 600A. In another example, the rocker retainer 602 and spring 606 may be comprised of plastic, metal, various other materials, or some combination thereof. FIG. 6B is a schematic view of a retention mechanism included on the bolster plate 210 with a heatsink assembly installed, according to an example. FIG. 6C is a schematic view of the bolster plate 210 with the retention mechanism 600A fitted on a guide pin 212 or retention pin, according to an example. As illustrated, a guide pin 212 may be fitted with a retention mechanism 600A. In another example, the bolster plate 210 includes different pins. For example, the different pins may be retention pins with the retention mechanisms 600A. In other words, the bolster plate 210 may be manufactured with the retention pins featuring the retention mechanisms 600A (in other words, a user may not have to add the retention mechanisms 600A, as the bolster plate 210 may already include the retention mechanisms 600A). In another example, the retention pins may be mounted to, welded to, added to, or assembled to the bolster plate 210. Further, the retention pins may be included on the bolster plate 210 at any angle (in relation to the direction the rocker retainer 602 of FIG. 6A may face). In other words, the rocker retainer 602 may face any direction.

Figure 7:
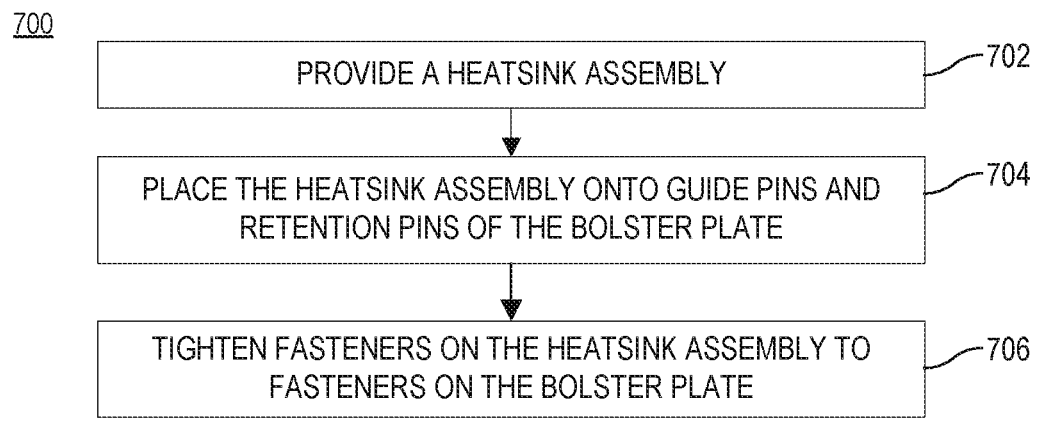
FIG. 7 is a flow chart of a method to add a heatsink assembly to a bolster plate, according to an example.

FIG. 7 is a flow chart of a method to add a heatsink assembly to a bolster plate, according to an example. Although execution of method 700 is described below with reference to the system of FIG. 1, other suitable systems may be utilized, including, but not limited to, the systems or components of FIGS. 2A-F, FIGS. 3A-D, FIGS. 4A-C, FIGS. 5A-C, and FIGS. 6A-C.

At block 702, a user may provide or procure a heatsink assembly 102 to be installed in computing device or some other system which contains a heat generating component. At block 704, a user may place the heatsink assembly 102 over or onto the guide pins and/or retention pins of a bolster plate. A user may, if the retention mechanisms 108 do not lock automatically, actuate the retention mechanisms 108 to lock the heatsink assembly 102 onto the bolster plate. In another example, the retention mechanism 108 may automatically lock or latch onto the guide pins and/or retention pins of the bolster plate. In another example, the retention mechanism 108 may be attached to the guide pins and/or retention pins rather than to the heatsink assembly 102.

At block 706, a user may then tighten fasteners on the heatsink assembly 102 in a specified order to fasteners on the bolster plate. In another example, a user may, due to the retention mechanisms 108 of the heatsink assembly 102, tighten the fasteners on the heatsink assembly 102 to fasteners on the bolster plate in any order (rather than a specified order)

In another example, to remove the heatsink assembly 102, a user may loosen the fasteners on the heatsink assembly from the fasteners on the bolster plate. Once the fasteners on the heatsink assembly are loosened from the fasteners on the bolster plate, a user may actuate the retention mechanisms 108 to unlock the retention mechanisms 108 from the guide pins and/or retention pins on the bolster plate. After the retention mechanisms 108 are unlocked, a user may lift the heatsink assembly 102 off of the bolster plate.

Although the flow diagram of FIG. 7 shows a specific order of execution, the order of execution may differ from that which is depicted. For example, the order of execution of two or more blocks or arrows may be scrambled relative to the order shown. Also, two or more blocks shown in succession may be executed concurrently or with partial concurrence. All such variations are within the scope of the present disclosure.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims

What is claimed is:

1. A system, comprising:
    a heatsink assembly, including:
        a heatsink with a base, the base including two apertures;
        retention mechanisms positioned over the two apertures to lock onto retention pins of a bolster plate, wherein the retention mechanisms each include:
            a retainer;
            a lock ring positioned over the retainer; and
            a push button inserted into the retainer and attached to the lock ring, wherein actuation of the push button downwards pushes the lock ring into a down position to lock the retainer onto the retention pin and actuation upwards lifts the lock ring into an up position.

2. The system of claim 1, wherein the apertures are positioned in opposite corners of the heatsink assembly.

3. The system of claim 1, wherein the retention mechanism includes a pin to be inserted into a retention feature fitted on the retention pins.

4. The system of claim 3, wherein the retention feature flexes to accept heat sink assembly removal and installation.

5. A system, comprising:
    a heatsink assembly, including:
        a heatsink with a base, the base including two apertures;
        a retention mechanism fitting to attach to guide pins, aligned with the apertures of the heatsink, wherein the retention mechanisms lock the heatsink assembly onto a bolster plate and wherein the retention fitting mechanism includes:
            a lever spring;
            a housing;
            a first pin to connect the lever spring to the housing;
            a rocker retainer; and
            a second pin to connect the rocker retainer to the metal housing.

6. The system of claim 5, wherein the rocker retainer is depressed as the heatsink assembly passes over the rocker retainer and the rocker retainer returns to a normal position after passing through the apertures.

7. The system of claim 5, wherein the guide pins are included on a bolster plate.

8. The system of claim 7, wherein the bolster plate includes four guide pins and two retention mechanisms are fitted to two of the guide pins.

9. The system of claim 5, wherein in response to the addition of the heatsink assembly to the bolster plate, the heatsink assembly is fastened to the bolster plate via screws to apply pressure and thermal contact with a processing resource.

10. The system of claim 9, wherein the screws can be tightened in any order.

\* \* \* \* \*